(12) United States Patent
Kim et al.

(10) Patent No.: US 11,672,190 B2
(45) Date of Patent: Jun. 6, 2023

(54) ELECTRONIC SYNAPTIC DEVICE AND METHOD FOR MANUFACTURING SAME

(71) Applicant: Industry-University Cooperation Foundation Hanyang University, Seoul (KR)

(72) Inventors: Tae Whan Kim, Seoul (KR); Jeong Woon Lee, Seoul (KR); Beom Hui Yoo, Seongnam-si (KR); Si Hyun Sung, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 29 days.

(21) Appl. No.: 17/315,434

(22) Filed: May 10, 2021

(65) Prior Publication Data
US 2022/0093854 A1 Mar. 24, 2022

(30) Foreign Application Priority Data
Sep. 23, 2020 (KR) ........................ 10-2020-0123143

(51) Int. Cl.
*H10N 70/20* (2023.01)
*H01L 45/00* (2006.01)

(52) U.S. Cl.
CPC .......... *H01L 45/10* (2013.01); *H01L 45/1233* (2013.01); *H01L 45/142* (2013.01);
(Continued)

(58) Field of Classification Search
CPC ... H01L 45/10; H01L 45/1233; H01L 45/142; H01L 45/143; H01L 45/144;
(Continued)

(56) References Cited

U.S. PATENT DOCUMENTS

| 2007/0080345 A1* | 4/2007 | Joo ........................ H01L 45/04 257/40 |
| 2020/0226452 A1* | 7/2020 | Rourk .................... G06N 10/00 |
| 2020/0371109 A1* | 11/2020 | Chiu .......................... C08J 3/11 |

FOREIGN PATENT DOCUMENTS

| JP | 2006-186363 A | 7/2006 |
| JP | 10-1962030 B1 | 7/2019 |

(Continued)

OTHER PUBLICATIONS

Office Action dated Oct. 22, 2021 in Korean Application No. 10-2020-0123143.

*Primary Examiner* — Jerome Leboeuf
(74) *Attorney, Agent, or Firm* — Sughrue Mion, PLLC

(57) ABSTRACT

An electronic synaptic device includes: a lower electrode; an upper electrode; and an active layer provided between the lower electrode and the upper electrode and including a plurality of conductive nanoparticles, wherein the conductive nanoparticles are dispersed in a matrix forming a continuous phase, and the matrix is composed of a protein. The electronic synaptic device has a low switching operation voltage, is capable of implementing a transition phenomenon from a short term potentiation state to a long term potentiation state even with a relatively low voltage, and has high stability; and, therefore, can be preferably applied as a memristive device for implementing neuromorphic computing.

14 Claims, 11 Drawing Sheets

(52) U.S. Cl.
CPC .......... *H01L 45/143* (2013.01); *H01L 45/144* (2013.01); *H01L 45/146* (2013.01); *H01L 45/148* (2013.01); *H01L 45/1608* (2013.01)

(58) Field of Classification Search
CPC . H01L 45/146; H01L 45/148; H01L 45/1608; H01L 45/14; H01L 45/1253
See application file for complete search history.

(56) References Cited

FOREIGN PATENT DOCUMENTS

| | | |
|---|---|---|
| KR | 10-2006-0073077 A | 6/2006 |
| KR | 10-2007-0032500 A | 3/2007 |
| KR | 10-2013-0127078 A | 11/2013 |
| KR | 10-2018-0106868 A | 10/2018 |
| WO | 2010/074689 A1 | 7/2010 |

\* cited by examiner

[FIG. 1]
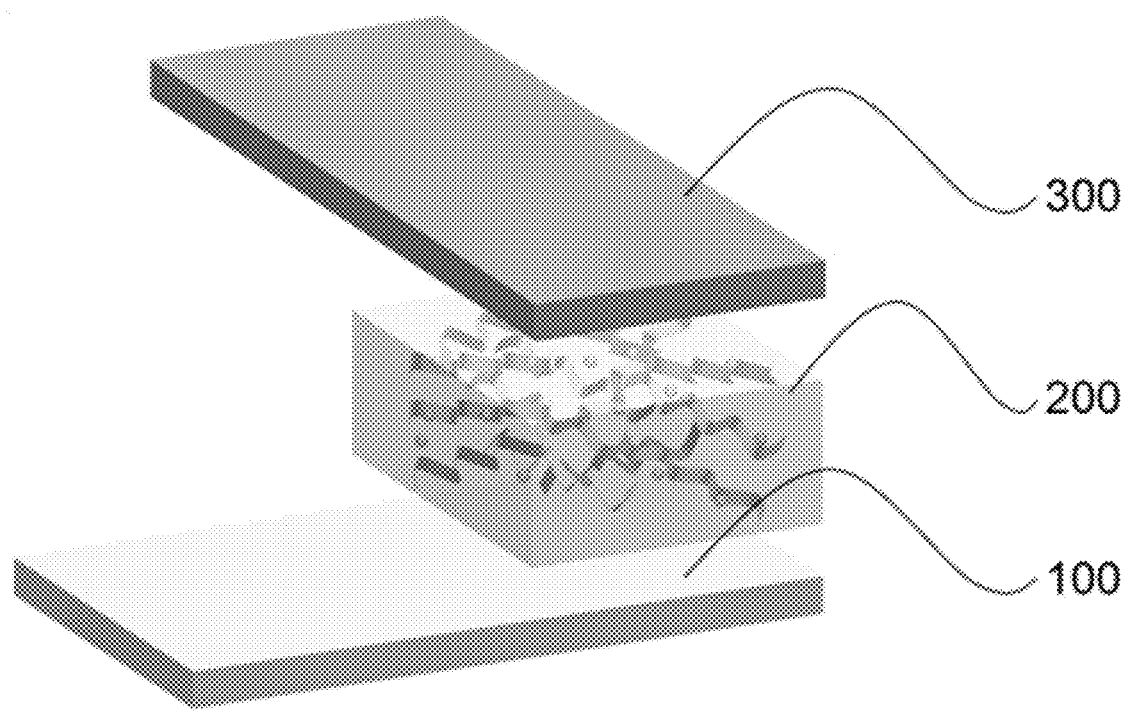

[FIG. 2A]
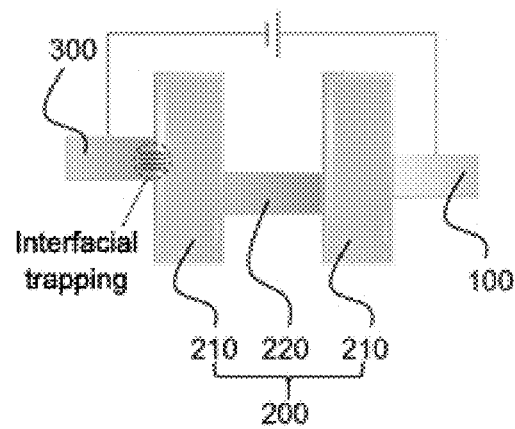
[FIG. 2B]
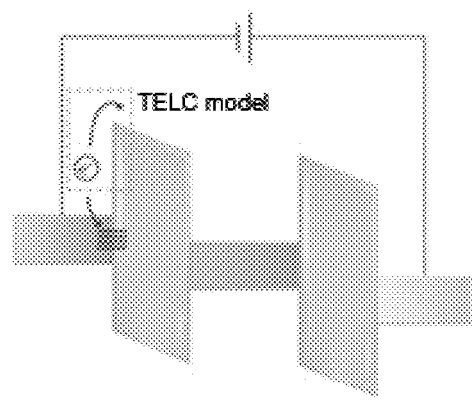
[FIG. 2C]
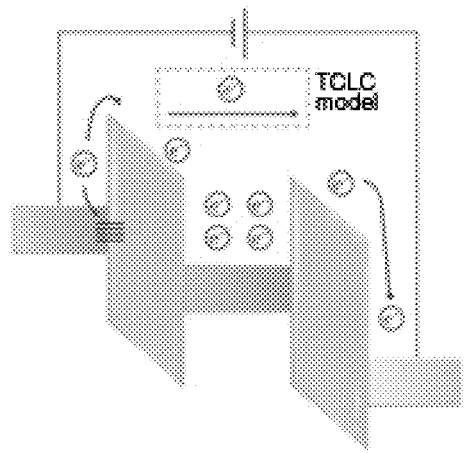

[FIG. 3A]
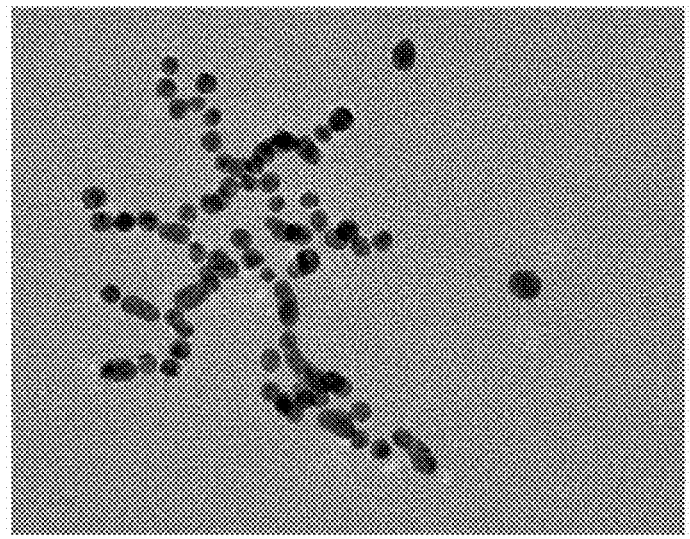
[FIG. 3B]
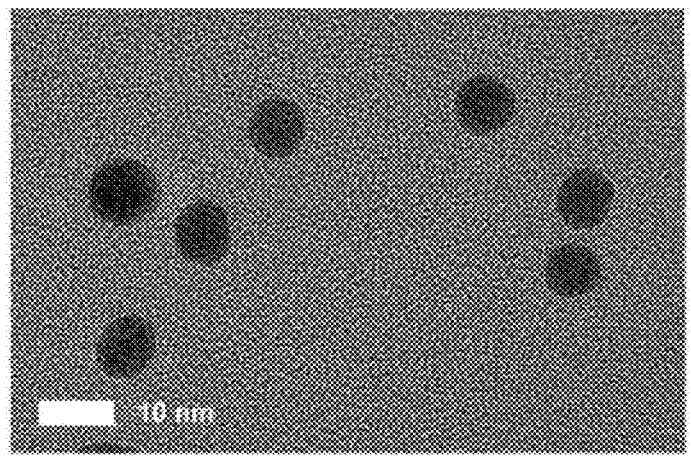
[FIG. 3C]
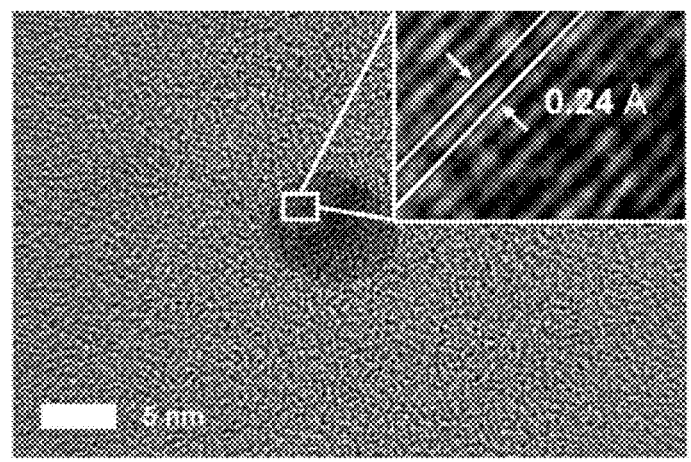

[FIG. 4]
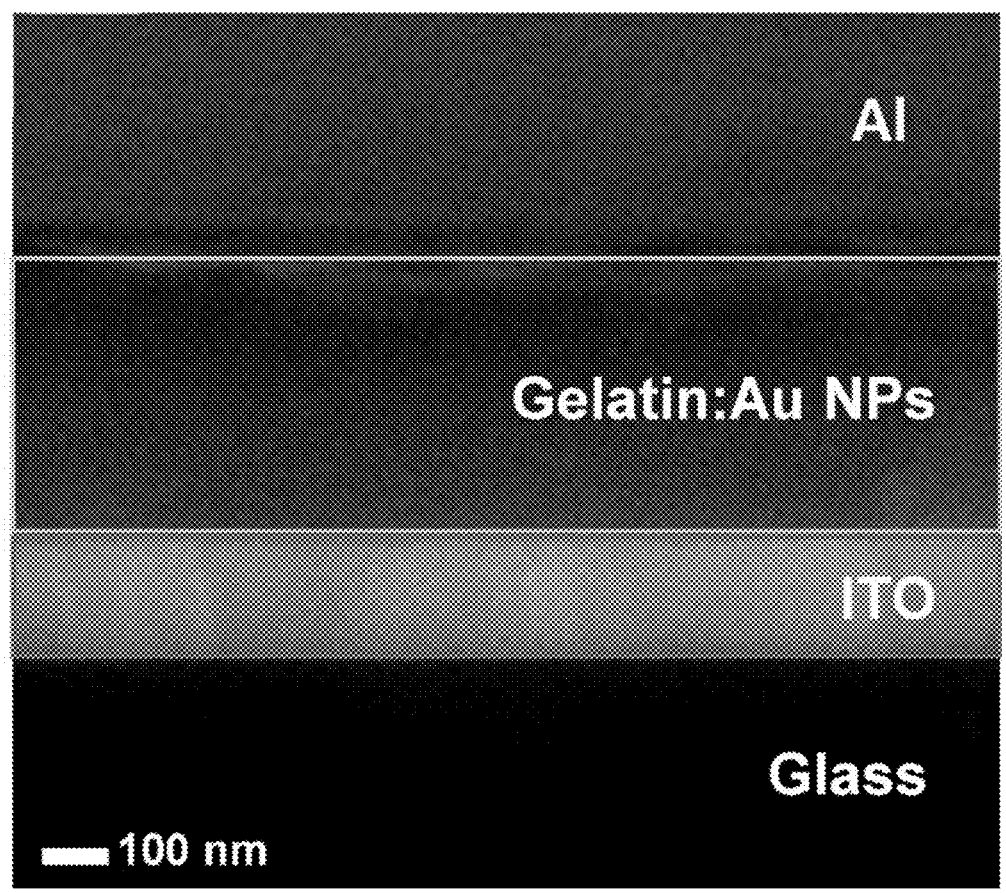

[FIG. 5A]
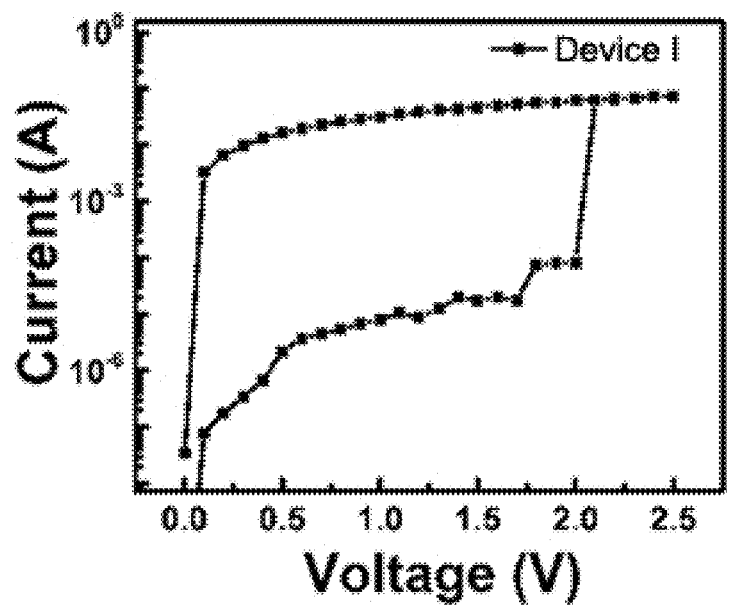
[FIG. 5B]
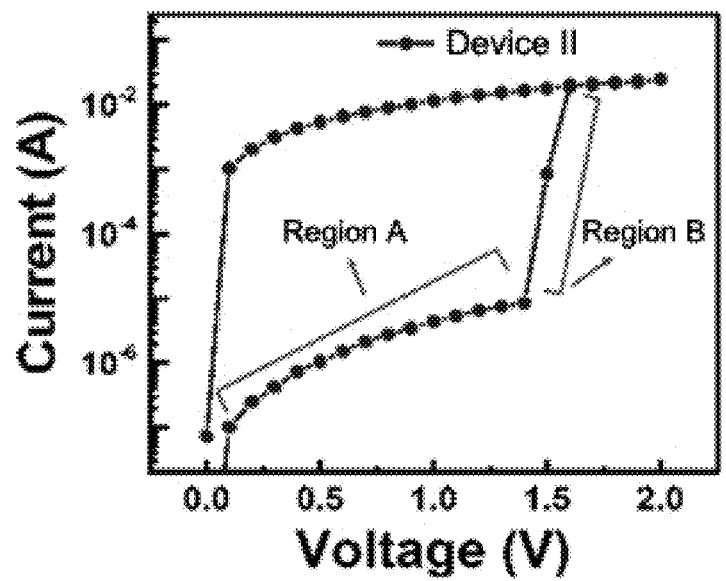

[FIG. 6]
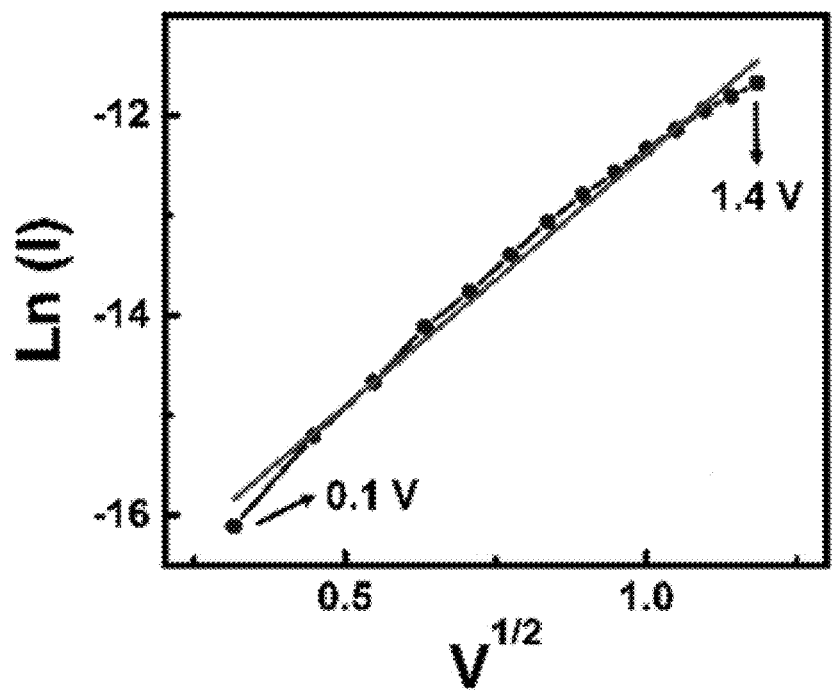
[FIG. 7]
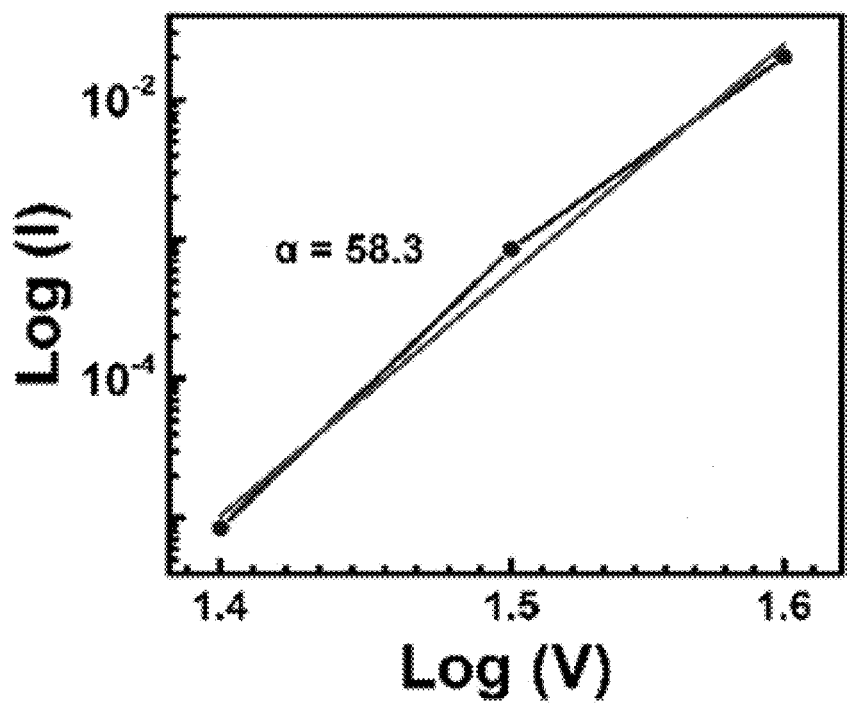

[FIG. 8]
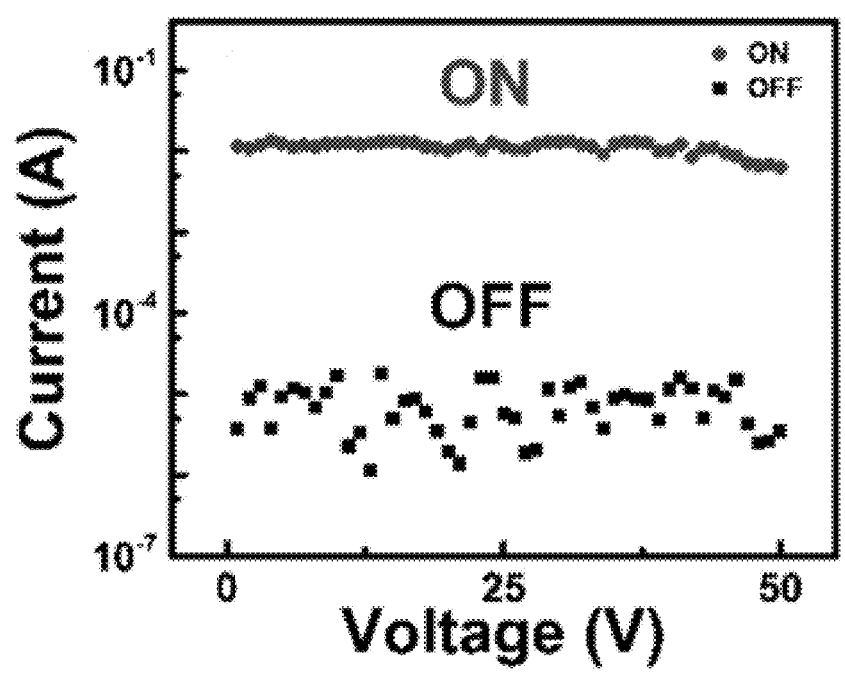

[FIG. 9A]
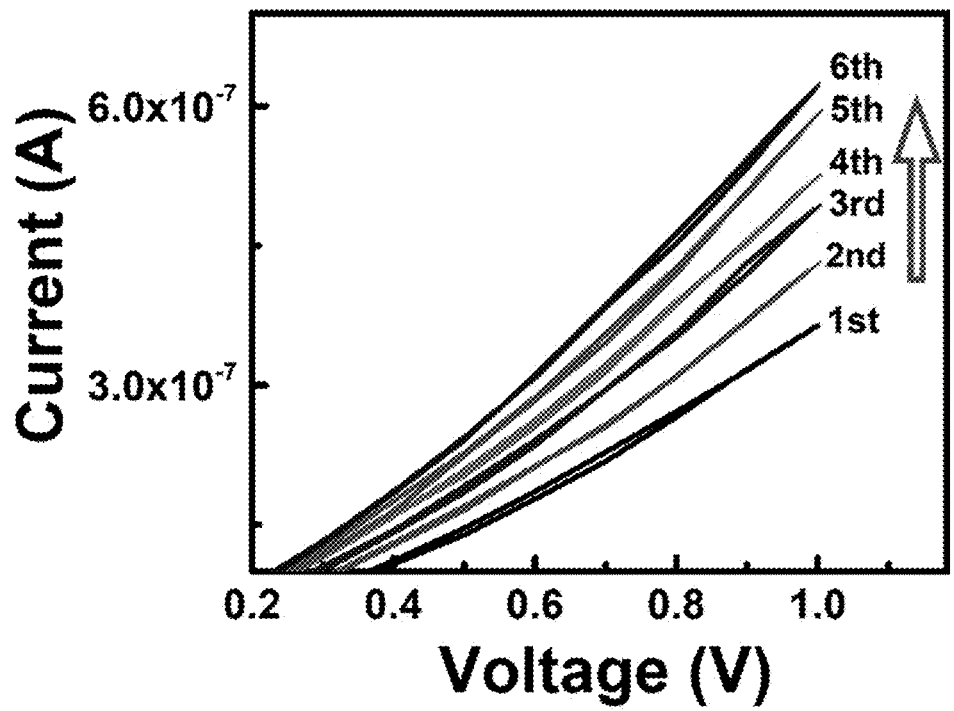
[FIG. 9B]
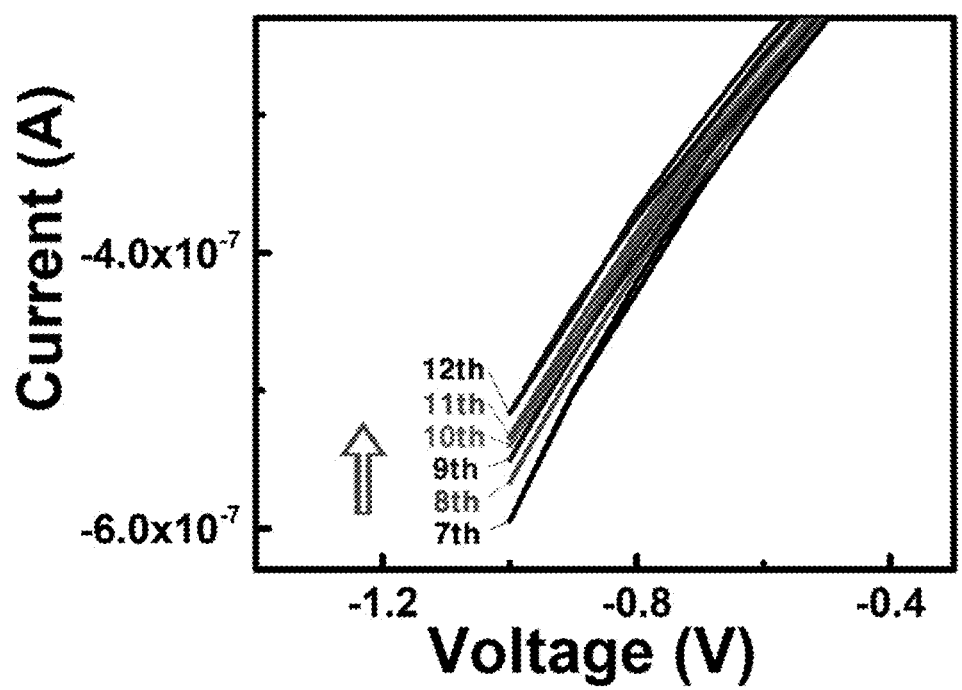

[FIG. 9C]
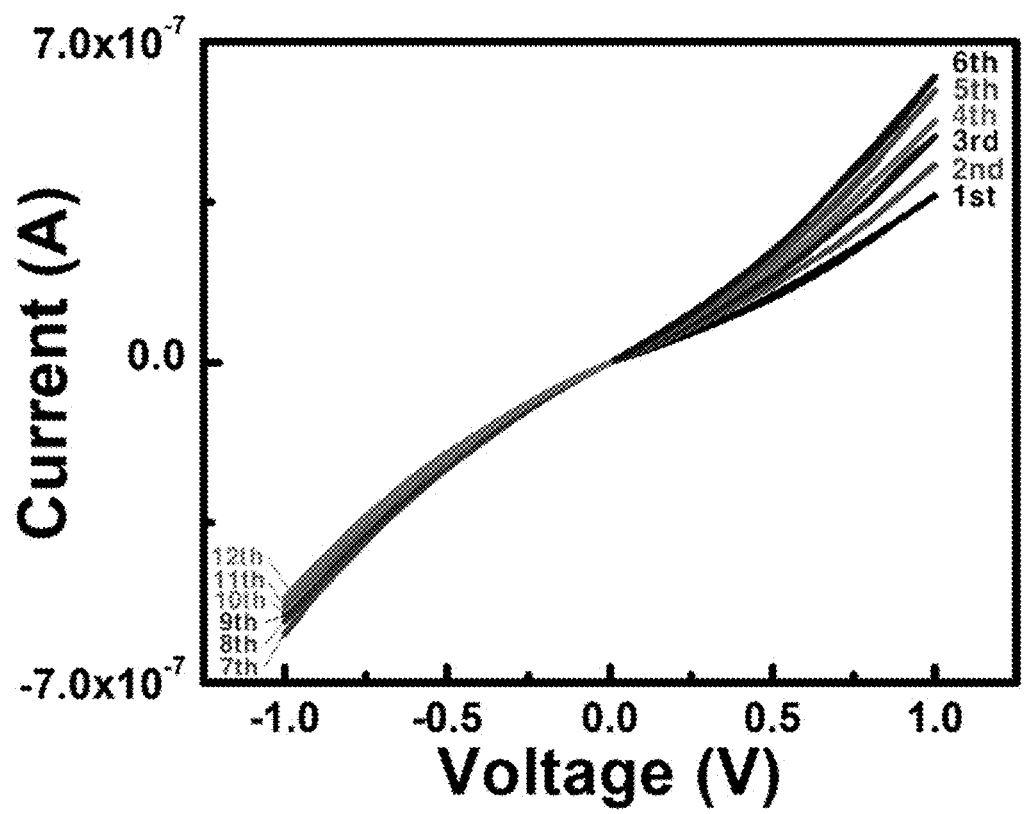

[FIG. 10]
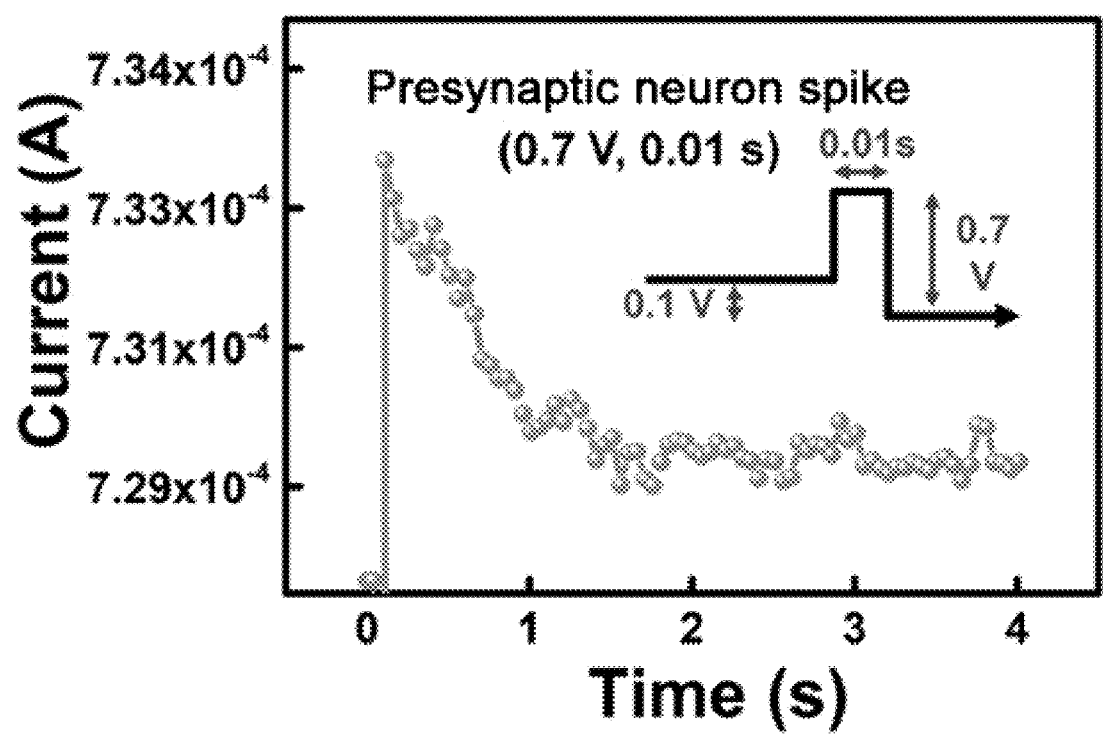

[FIG. 11A]
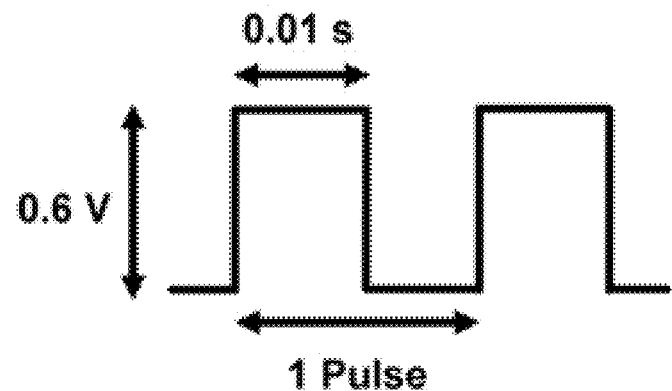
[FIG. 11B]
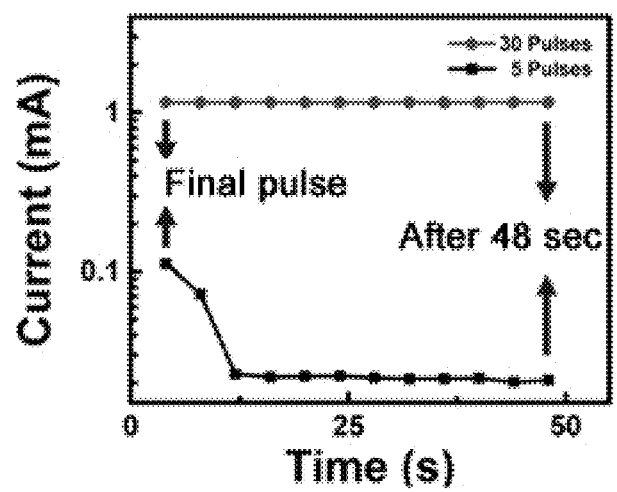
[FIG. 11C]
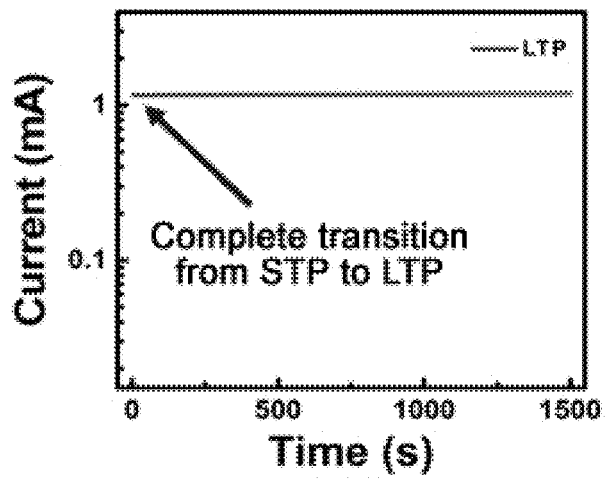

ELECTRONIC SYNAPTIC DEVICE AND METHOD FOR MANUFACTURING SAME

CROSS REFERENCE TO RELATED APPLICATIONS

This application claims priority based on Korean Patent Application No. 10-2020-0123143, filed Sep. 23, 2020, the entire contents of which are incorporated herein by reference.

TECHNICAL FIELD

The present invention relates to an electronic synaptic device and a method for manufacturing the same, and more particularly, to an electronic synaptic device which can be preferably used as a memristive device for implementing neuromorphic computing, and a method for manufacturing the same.

BACKGROUND ART

Recently, with the development of artificial intelligence technology, neuromorphic computing technology, which can process information with low power, is in the spotlight as an alternative to the existing Von Neumann's computing system, and research on an electronic synaptic device as a memristive device for implementing the neuromorphic computing is being actively conducted.

As one of such electronic synaptic devices, a resistance random access memory (ReRAM) using a resistance-variable material is known, wherein the ReRAM has a metal-insulator-metal structure and operates while changing from a state in which the resistance of the insulator is high (a state in which electrical conductivity is low) to a state in which the resistance of the insulator is low (a state in which electrical conductivity is high) by an applied voltage. The resistance random access memory is ideal for application as a nonvolatile memory device due to the above characteristics.

Most of the conventional resistance random access memories are oxygen vacancy type resistance random access memories, and store data (resistance) by forming a filament based on the oxygen vacancy behavior to make a phase transition from a high resistance state to a low resistance state. For example, International Publication No. WO2010/074689 discloses a resistance random access memory including two mobile species in which an active region provided between two electrodes is used as oxygen vacancy.

However, these conventional resistance random access memories have disadvantages in that a switching operation voltage is high, a high voltage is required to implement a transition phenomenon from a short term potentiation state to a long term potentiation state, and a stability of the device is low.

DISCLOSURE

Technical Problem

The present invention has been devised to solve the problems of the prior art as described above, and one of the various objects of the present invention is to provide an electronic synaptic device which has a low switching operation voltage, is capable of implementing a transition phenomenon from a short term potentiation state to a long term potentiation state with a relatively low voltage, and has high stability.

Another object of the present invention is to provide a method for manufacturing the electronic synaptic device.

Still another object of the present invention is to provide a neuromorphic device comprising the electronic synaptic device.

Technical Solution

In order to achieve the above objects, the present invention provides an electronic synaptic device comprising: a lower electrode; an upper electrode; and an active layer provided between the lower electrode and the upper electrode and comprising a plurality of conductive nanoparticles, wherein the conductive nanoparticles are dispersed in a matrix forming a continuous phase, and the matrix is composed of a protein.

In the present invention, the conductive nanoparticles may be metal nanoparticles including at least one metal selected from the group consisting of Au, Zn, Cu, In, Ag, Sn, Sb, Ni, Fe, and Pt.

In the present invention, the conductive nanoparticles may be metal oxide nanoparticles including at least one metal oxide selected from the group consisting of $SiO_2$, CaO, $Cr_2O_3$, $MnO_2$, $TiO_2$, $ZrO_2$, $Y_2O_3$, MgO, $HfO_2$, ZnO, $Al_2O_3$, $SnO_2$, ITO (Indium tin oxide) and InZO (Indium zinc oxide).

In the present invention, the conductive nanoparticles may be metal nitride nanoparticles including at least one metal nitride selected from the group consisting of TiN, ZrN, NbN, CrN, VN, TaN, WN, AlN, GaN, InN and $Si_3N_4$.

In the present invention, the conductive nanoparticles may be conductive polymer nanoparticles including at least one conductive polymer selected from the group consisting of polymethyl methacrylate (PMMA), polyethylene (PE), polyethyleneimine (PEI), poly(3,4-ethylenedioxythiophene) (PEDOT), polytetrafluoroethylene (PTFE), polyvinylidene fluoride (PVDF) and poly(vinylphenol) (PVP).

In the present invention, the conductive nanoparticles may be one or more quantum dots selected from the group consisting of CdS quantum dots, ZnSe quantum dots, ZnS quantum dots, CdSe quantum dots, CdTe quantum dots, PbS quantum dots, PbSe quantum dots, InP quantum dots, GaAs quantum dots, GaN quantum dots, graphene quantum dots, CNT quantum dots, $CH_3NH_3PbBr$ perovskite quantum dots, $WS_2$ quantum dots, $MoS_2$ quantum dots, $CsPbCl_3$ perovskite quantum dots, $CuInS_2$ quantum dots, $Cu_2ZnSnS_4$ quantum dots, CdTe/ZnTe quantum dots having a core-shell structure, $Au/Al_2O_3$ quantum dots having a core-shell structure, InP/GaAs quantum dots having a core-shell structure, CdTe/CdZnTe quantum dots having a core-shell structure, CdSe/CdS/ZnS quantum dots having a core-shell-shell structure, and CdSe/ZnS quantum dots having a core-shell structure.

In the present invention, the protein may be gelatin.

In the present invention, an average particle diameter of the conductive nanoparticles may be 5 to 100 nm.

In the present invention, a ratio of the total volume of the conductive nanoparticles to the total volume of the matrix may be 1:5 to 1:10.

In the present invention, a thickness of the active layer may be 10 to 1000 nm.

In the present invention, the active layer may have a multilayer structure of two or three layers.

In the present invention, the electronic synaptic device may be a nonvolatile memory device whose resistance changes according to an applied voltage.

The present invention also provides a neuromorphic device comprising the electronic synaptic device.

The present invention also provides a method for manufacturing an electronic synaptic device, the method comprising the steps of: forming a lower electrode, forming an active layer, and forming an upper electrode, wherein the step of forming the active layer includes the steps of: preparing a protein solution; mixing conductive nanoparticles with the protein solution to obtain a mixed solution; and coating or depositing the mixed solution on the lower electrode.

Advantageous Effects

The electronic synaptic device according to the present invention has a low switching operation voltage, is capable of implementing a transition phenomenon from a short term potentiation state to a long term potentiation state even with a relatively low voltage, and has high stability. Therefore, it can be preferably applied as a memristive device for implementing neuromorphic computing.

Various and beneficial advantages and effects of the present invention are not limited to the above-described contents, and may be more easily understood in the course of describing specific embodiments of the present invention.

BRIEF DESCRIPTION OF DRAWINGS

FIG. 1 shows a schematic diagram of an electronic synaptic device according to an embodiment of the present invention.

FIGS. 2A, 2B and 2C are conceptual diagrams for explaining a switching mechanism of an electronic synaptic device according to an embodiment of the present invention.

FIGS. 3A, 3B and 3C are transmission electron microscopy (TEM) images of a protein-conductive nanoparticle mixed solution according to an embodiment of the present invention.

FIG. 4 is a cross-sectional scanning electron microscope (SEM) image of an electron synaptic device according to an embodiment of the present invention.

FIG. 5A is a graph showing a current-voltage (I-V) curve of device I, and FIG. 5B is a graph showing a current-voltage (I-V) curve of device II.

FIG. 6 is a graph plotting a value of Ln(I) versus a value of $V^{1/2}$ in region A of the current-voltage (I-V) curve of the device II (FIG. 5B).

FIG. 7 is a graph plotting a value of Log(I) versus a value of Log(V) in region B of the current-voltage (I-V) curve of the device II (FIG. 5B).

FIG. 8 is a graph showing an endurance capability of ON/OFF switching for device II.

FIG. 9A is a graph showing a current-voltage (I-V) curve of device II under a consecutive positive voltage sweep; FIG. 9B is a graph showing a current-voltage (I-V) curve of device II under a consecutive negative voltage sweep; and FIG. 9C is a graph showing a current-voltage (I-V) curve of device II under a consecutive dual voltage sweep.

FIG. 10 shows a result of measuring a current of device II after inputting a specific pulse signal to the device.

FIGS. 11A, 11B and 11C show results of measuring a current change of device II over time after applying a continuous pulse to the device.

DETAILED DESCRIPTION OF EMBODIMENTS

Hereinafter, various embodiments of the present invention will be described in detail with reference to the accompanying drawings. These embodiments may be modified in different forms or may be combined with each other, and the scope of the present invention is not limited to the embodiments described below. In addition, the present embodiments are provided to more completely explain the present invention to a person ordinarily skilled in the art. For example, the shapes and sizes of elements in the drawings may be exaggerated for clearer explanation.

In the specification, when a component such as a substrate or a layer is said to be "on" another component, this may include not only a case the component is directly above another component, but also a case where there is still another component between the two components.

The terms used in the specification are only used to describe exemplary embodiments, and are not intended to limit the present invention. Singular expressions include plural expressions unless the context clearly indicates otherwise. In the specification, it is to be understood that terms such as "comprise", "include" or "have" are intended to designate the presence of a recited feature, number, step, component, or combination thereof, but does not preclude the possibility of the presence or addition of one or more other features, numbers, steps, components, or combinations thereof.

The present invention may be variously changed and may have various forms, and specific embodiments will be illustrated and described in detail below. However, it is to be understood that the present invention is not intended to be limited to the disclosed specific embodiments, and includes all changes, equivalents and substitutes included in the spirit and scope of the present invention.

FIG. 1 shows a schematic diagram of an electronic synaptic device according to an embodiment of the present invention.

Referring to FIG. 1, an electronic synaptic device according to an embodiment of the present invention includes a lower electrode 100, an active layer 200 formed on the lower electrode, and an upper electrode 300 formed on the active layer.

In the present invention, the electronic synaptic device is not specifically limited in terms of its kind, but may be, for example, a nonvolatile memory device in which a resistance is changed according to an applied voltage.

In the present invention, the lower electrode 100 may include a conductive metal or a conductive oxide.

The conductive metal or conductive oxide used as the lower electrode is not particularly limited in terms of its kind. For example, the conductive metal may be aluminum (Al), silver (Ag), copper (Cu), platinum (Pt), ruthenium (Ru), iridium (Ir), tungsten (W), gold (Au), indium (In), gallium (Ga), zinc (Zn), molybdenum (Mo), or an alloy thereof, and the conductive oxide may be at least one of TO (Tin oxide), ATO (Antimony doped Tin oxide), FTO (Fluorine doped Tin oxide), ITO (Indium Tin Oxide), FITO (Fluorinated Indium Tin oxide), IZO (Indium doped Zinc oxide), AZO (Al-doped ZnO) and ZnO (zinc oxide).

The lower electrode 100 may be formed on a substrate, wherein the substrate serves to support the lower electrode 100. The material of the substrate is not particularly limited, but may include at least one selected from glass, silicon, SOI (Silicon on insulator), PET (polyethylene terephthalate), PES (polyethersulfone), PS (polystyrene), PC (polycarbonate), PI (polyimide), PEN (polyethylene naphthalate) and PAR (polyarylate). Among these, when the substrate is a plastic substrate including at least one selected from PET (polyethylene terephthalate), PES (polyethersulfone), PS (polystyrene), PC (polycarbonate), PI (polyimide), PEN (polyethylene naphthalate), and PAR (polyarylate), there is an advantage of providing a flexible property to the electronic synaptic device.

The lower electrode 100 may be formed by forming a film for forming a lower electrode on a substrate, forming a photoresist pattern, and patterning the substrate using the photoresist pattern as a mask.

The lower electrode 100 may be formed by any one of sputtering, pulsed laser deposition (PLD), thermal evaporation, electron-beam evaporation, physical vapor deposition (PVD), molecular beam epitaxy (MBE), chemical vapor deposition (CVD), and a solution process method, but is not limited thereto.

In the present invention, the upper electrode 300 may include a conductive metal or a conductive oxide.

In the present invention, the conductive metal or conductive oxide used as the upper electrode is not particularly limited in terms of its kind. For example, the conductive metal may be aluminum (Al), silver (Ag), copper (Cu), platinum (Pt), ruthenium (Ru), iridium (Ir), tungsten (W), gold (Au) indium (In), gallium (Ga), zinc (Zn), molybdenum (Mo), or an alloy thereof, and the conductive oxide may be at least one of TO (Tin oxide), ATO (Antimony doped Tin oxide), FTO (Fluorine doped Tin oxide), ITO (Indium Tin Oxide), FITO (Fluorinated Indium Tin oxide), IZO (Indium doped Zinc oxide), AZO (Al-doped ZnO) and ZnO (zinc oxide).

The upper electrode 300 may be formed by the same method as that of the lower electrode 100, and the direction of the upper electrode 300 may be formed in a direction crossing the direction of the lower electrode 100.

In the present invention, the active layer 200 is provided between the lower electrode 100 and the upper electrode 300 to store electric charges.

The active layer 200 may have a single layer structure of one layer, or may have a multilayer structure of two or three layers.

The thickness of the active layer 200 may be 10 to 1000 nm. In this case, it is easy to form the active layer using spin coating, and further, it is possible to form the active layer that is not affected by the size of the conductive nanoparticles.

The active layer 200 includes a matrix 210 forming a continuous phase, wherein the matrix may be composed of proteins (including peptides) which exhibit insulator properties at room temperature but are denatured when receiving thermal energy to exhibit conductive properties.

In the present invention, as the matrix 210 of the active layer 200 is composed of proteins as described above, the device not only has flexibility, transparency, non-toxicity, biocompatibility and biodegradability, but also has the advantage of being easily manufactured.

In the present invention, the protein used as the matrix 210 of the active layer 200 may be, for example, any one of a natural protein, a fusion protein and a recombinant protein.

When the protein forming the matrix 210 of the active layer 200 is a natural protein, it may be, for example, gelatin, fibroin, sericin, albumin, ferritin, collagen, lignin, preferably may be gelatin. Gelatin has an advantage of improving device characteristics by lowering an operating voltage when used together with Au nanoparticles to be described later.

However, in the case of fabricating the active layer 200 using only the protein matrix, a disadvantage has been found in that a switching voltage from a high resistance state to a low resistance state is high. Accordingly, the present invention has attempted to lower the switching voltage by changing the resistance of the device, which has been solved by dispersing the conductive nanoparticles 220 in the matrix 210 forming a continuous phase. These conductive nanoparticles 220 contribute to a carrier transport mechanism by forming a trap site. Meanwhile, electrons move from a negative electrode to a positive electrode through the above trap site in the process of driving the device, thereby changing the resistance of the device.

As the conductive nanoparticles 220 dispersed in the matrix 210 of the active layer 200 in the present invention, for example, any one of metal nanoparticles, metal oxide nanoparticles, metal nitride nanoparticles, conductive polymer nanoparticles and quantum dots may be used, preferably metal nanoparticles may be used.

When the conductive nanoparticle 220 is a metal nanoparticle, it may include at least one metal selected from the group consisting of Au, Zn, Cu, In, Ag, Sn, Sb, Ni, Fe and Pt, and preferably may be Au nanoparticles or a mixture of Au nanoparticles and other nanoparticles. Since Au nanoparticles exhibit biocompatibility, bioconjugation and non-cytotoxicity, when the Au nanoparticles are used as the conductive nanoparticles, there is an advantage that the electronic synaptic device can be implanted into a living body and used directly in a biological neural network.

In addition, when the conductive nanoparticle 220 is a metal oxide nanoparticle, it may include one or more metal oxides selected from the group consisting of $SiO_2$, CaO, $Cr_2O_3$, $MnO_2$, $TiO_2$, $ZrO_2$, $Y_2O_3$, MgO, $HfO_2$, ZnO, $Al_2O_3$, $SnO_2$, ITO (Indium tin oxide) and InZO (Indium zinc oxide), but is not limited thereto.

Further, when the conductive nanoparticle 220 is a metal nitride nanoparticle, it may include a metal nitride nanoparticle comprising at least one metal nitride selected from the group consisting of TiN, ZrN, NbN, CrN, VN, TaN, WN, AlN, GaN, InN and $Si_3N_4$, but is not limited thereto.

In addition, when the conductive nanoparticle 220 is a conductive polymer nanoparticle, it may include at least one conductive polymer selected from the group consisting of polymethyl methacrylate (PMMA), polyethylene (PE), polyethyleneimine (PEI), poly(3,4-ethylenedioxythiophene) (PEDOT), polytetrafluoroethylene (PTFE), polyvinylidene fluoride (PVDF) and poly(vinylphenol) (PVP), but is not limited thereto.

In addition, when the conductive nanoparticles 220 are quantum dots, they may be at least one quantum dot selected from the group consisting of CdS quantum dots, ZnSe quantum dots, ZnS quantum dots, CdSe quantum dots, CdTe quantum dots, PbS quantum dots, PbSe quantum dots, InP quantum dots, GaAs quantum dots, GaN quantum dots, graphene quantum dots, CNT quantum dots, $CH_3NH_3PbBr$ perovskite quantum dots, $WS_2$ quantum dots, $MoS_2$ quantum dots, $CsPbCl_3$ perovskite quantum dots, $CuInS_2$ quantum dots, $Cu_2ZnSnS_4$ quantum dots, CdTe/ZnTe quantum dots having a core-shell structure, $Au/Al_2O_3$ quantum dots having a core-shell structure, InP/GaAs quantum dots having a core-shell structure, CdTe/CdZnTe quantum dots having a core-shell structure, CdSe/CdS/ZnS quantum dots having a core-shell-shell structure, and CdSe/ZnS quantum dots having a core-shell structure, but are not limited thereto.

The average particle diameter of the conductive nanoparticles 220 may be 1 to 100 nm, more preferably 5 to 50 nm. Here, the particle diameter means an equivalent circular diameter of particles detected by observing a cross section of the active layer. The average particle diameter of the conductive nanoparticles can be appropriately adjusted in consideration of the thickness of the active layer.

The ratio of the total volume of the conductive nanoparticles 220 to the total volume of the matrix 210 of the active layer 200 may be 5:1 to 10:1.

The electronic synaptic device according to the present invention may be manufactured by a manufacturing method comprising the steps of: forming a lower electrode, forming an active layer on the lower electrode, and forming an upper electrode on the active layer.

In the present invention, the lower electrode and the upper electrode may be formed in the same manner as described above.

In the present invention, the active layer may be formed by a method comprising the steps of: preparing a protein solution; mixing conductive nanoparticles with the protein solution to obtain a mixed solution; and coating or depositing the mixed solution on the lower electrode.

In the above method, the coating may be spin coating or spray coating, and the deposition may be vacuum thermal evaporation, but is not limited thereto.

In the protein-nanoparticle mixed solution, a volume ratio of the protein solution to the conductive nanoparticles may be 5:1 to 10:1.

The active layer may be formed as a single layer, or may be formed as a multilayer of two or three layers.

After coating or depositing the active layer, it may further include the step of heating the active layer, if necessary.

FIGS. 2A, 2B and 2C are conceptual diagrams for explaining a switching mechanism of an electronic synaptic device according to an embodiment of the present invention, wherein FIG. 2A corresponds to the case of no applied voltage, FIG. 2B corresponds to the case of a low voltage, and FIG. 2C corresponds to the case of a high voltage.

Referring to FIG. 2A, during evaporation of the upper electrode, some of the metal atoms constituting the upper electrode diffuse into the protein matrix, and the diffused metal atoms act as trap sites at the heterointerface of the upper electrode/active layer.

Referring to FIG. 2B, electrons trapped at the heterointerface of the upper electrode/active layer are excited due to thermal energy, and some of them pass through a barrier the protein matrix. This can be explained using the TELC (Thermionic Emission Limited Conduction) model below.

$$I \propto AT^2 \exp\left[-\frac{q\varphi}{kT} + q\left(\frac{q^2 V}{4\pi\varepsilon}\right)^{1/2}\right], \quad (1)$$

wherein I, V, A, T, φ, ε, k and q are current, applied voltage, Richardson constant, absolute temperature, barrier height, dielectric constant, Boltzmann constant, and electron charge, respectively.

Referring to FIG. 2C, electrons excited at high voltage are trapped at trap sites of the conductive nanoparticles, which corresponds to a dominant carrier transport mechanism in the electronic synaptic device of the present invention. This can be explained using a TCLC (Trapped Charge-Limited Current) model.

On the other hand, in the case of the conventional electronic synaptic device which forms a filament based on the behavior of oxygen vacancy, there is a disadvantage that the amount of current change due to the potentiation and depression phenomena in a state in which the filament is formed is small. In contrast, the electronic synaptic device of the present invention surprisingly shows a state in which the current increases or decreases continuously when a constant voltage is repeatedly applied. These properties are quite similar to the phenomena of potentiation and inhibition at biological synapses.

In addition, as confirmed in the Examples to be described later, the electronic synaptic device of the present invention can implement synaptic characteristics according to a resistance change even with a low voltage of less than 1V; exhibits biological synaptic characteristics such as excitatory postsynaptic current (EPSC), a transition phenomenon from short term potentiation (STP) to long term potentiation (LTP); and further maintains a constant current in the long term potentiation state for 1500 seconds or more, and thus exhibits stable electrical characteristics.

The electronic synaptic device of the present invention can operate at a low voltage, and thus can be preferably used as a memristive device for implementing neuromorphic computing.

EXAMPLES

Hereinafter, the present invention will be described in more detail through examples. However, these examples show some experimental methods and compositions for illustrating the present invention by way of example, and the scope of the present invention is not limited to these examples.

Preparation Example 1

Preparation of a Protein Solution in which Conductive Nanoparticles are Mixed

Gelatin powder (Sigma-Aldrich, CAS No.: 9000-70-8) was dissolved in distilled water (3 mol/L) and stirred at a speed of 400 rpm for 24 hours to prepare a gelatin solution. Gold nanoparticles (Aldrich) were mixed with the prepared gelatin solution in a volume ratio of 7.5:1. Thereafter, ultrasonic treatment was performed at room temperature for 30 minutes to obtain a gelatin solution in which gold nanoparticles were mixed.

FIGS. 3A, 3B and 3C are transmission electron microscopy (TEM) images of the gelatin solution in which gold nanoparticles are mixed. Referring to FIGS. 3A, 3B and 3C, it can be seen that the gold nanoparticles are randomly distributed in the gelatin solution, and have an average diameter of about 8 nm, a lattice parameter of 0.24 Å, and a shape of an approximate sphere.

Preparation Example 2

Preparation of an Electronic Synaptic Device

A glass substrate coated with ITO (Indium tin oxide) was chemically cleaned by ultrasonic treatment with acetone, methanol, and distilled water in this order for 30 minutes each. The cleaned glass substrate was dried using nitrogen gas having a purity of 99.999%.

The gelatin solution in which gold nanoparticles are mixed as prepared in Preparation Example 1 was spin-coated on the dried glass substrate at a speed of 2,500 rpm for 25 seconds, and then annealed on a hot plate at 100° C. for 20 minutes to form an active layer.

An electronic synaptic device was manufactured by thermal evaporation of Al on the active layer at a system pressure of $1\times10^{-6}$ Torr to form an Al upper electrode having a thickness of 220 nm and a diameter of 1 mm.

FIG. 4 is a cross-sectional scanning electron microscope (SEM) image of an electron synaptic device according to an embodiment of the present invention. Referring to FIG. 4, it can be seen that the boundary between the active layer and the upper and lower electrodes is clearly observed. The thickness of the active layer was about 500 nm.

Experimental Example 1

Electrical Characteristics Test

In order to investigate a change in electrical properties depending on the presence or absence of conductive nanoparticles, a voltage was applied to each of an electronic synaptic device having an active layer composed of only a gelatin matrix (device I) and an electronic synaptic device having an active layer in which gold nanoparticles are dispersed in a gelatin matrix (device II, electronic synaptic device of Preparation Example 2), and a current according thereto was measured. FIG. 5A is a graph showing a current-voltage (I-V) curve of the device I, and FIG. 5B is a graph showing a current-voltage (I-V) curve of the device II. In FIGS. 5A and 5B, threshold voltages characteristics were measured under a voltage sweep.

Referring to FIG. 5A, it can be seen that when the applied voltage is increased from 0V to 2.5V for the device I, the current flowing through the device I at about 2V increases rapidly, which means that the device I has changed from an insulated state to a conductive state. The current flowing through the device I returns to an off state when a reverse voltage sweep from 2.5V to 0V is applied.

Referring to FIG. 5B, it can be seen that when the applied voltage is increased from 0V to 2V for the device II, the current flowing through the device II at about 1.4V increases rapidly, which means that the device II has changed from an insulated state to a conductive state. The current flowing through the device II returns to an off state when a reverse voltage sweep from 2V to 0V is applied.

From the results of FIGS. 5A and 5B, it can be seen that when the conductive nanoparticles are dispersed in the protein matrix of the active layer, the threshold voltage can be significantly lowered, and thus the device can be driven even at a low voltage.

Experimental Example 2 investigation of Carrier Transport Mechanism

FIG. 6 is a graph plotting a value of Ln(I) versus a value of $V^{1/2}$ in region A of the current-voltage (I-V) curve of the device II (FIG. 5B). Referring to FIG. 6, the value of ln(I) in region A of the device II (i.e., at a voltage of about 1.4 V or less) increases linearly with respect to the value of $V^{1/2}$. Accordingly, it can be seen that the carrier transport mechanism of the device in this region can be explained using the TELC model. In the region A, the current of the device II is relatively low, because only a small number of electrons generated at a negative applied voltage are trapped at the heterointerface of the upper electrode/active layer. This interfacial trapping results from the diffusion of metal atoms constituting the upper electrode.

FIG. 7 is a graph plotting a value of Log(I) versus a value of Log(V) in region B of the current-voltage (I-V) curve of device II (FIG. 5B). Referring to FIG. 7, the value of Log(I) in region B of the device II (i.e., at a voltage of about 1.4V or more and 1.6V or less) increases linearly with respect to the value of Log(V) ($\alpha \gg 2$). Accordingly, it can be seen from this that the carrier transport mechanism of the device in this region can be explained using the TCLC model. This is reasonably consistent with the carrier transport mechanism in FIG. 2C.

FIG. 8 is a graph showing an endurance capability of ON/OFF switching for device II. Referring to FIG. 8, the ON/OFF switching for the device II is maintained for 50 cycles or more. Accordingly, it can be seen that the device II exhibits excellent device stability.

Experimental Example 3

Synaptic Response Characteristics

FIG. 9A is a graph showing a current-voltage (I-V) curve of device II under a consecutive positive voltage sweep; FIG. 9B is a graph showing a current-voltage (I-V) curve of device II under a consecutive negative voltage sweep; and FIG. 9C is a graph showing a current-voltage (I-V) curve of device II under a consecutive dual voltage sweep.

When six consecutive positive voltage sweeps (from 0V to 1V, from 1V to 0V) are applied to device II, the current at an applied voltage of 1V increases from about $3.64\times10^{-7}$ A to about $6.24\times10^{-7}$ A, as shown in FIG. 9A. Then, when six consecutive negative voltage sweeps (from 0V to $-1$V, from $-1$V to 0V) are applied to device II, the current at an applied voltage of $-1$V decreases from about $-5.95\times10^{-7}$ A to about $-5.16\times10^{-7}$ A, as shown in FIG. 9B.

From the fact that the current at the applied voltages of 1V and $-1$V gradually increases and decreases due to the consecutive sweep, it can be seen that the electronic synaptic device of the present invention exhibits the potentiation and depression phenomena of biological synapses, and successfully mimics changes in weights of biological synapses related to small learning and memorization. In particular, the electronic synaptic device of the present invention can implement synaptic characteristics according to a change in resistance at a low voltage of less than 1V, which is similar to a behavior of a biological synapse operating under low power.

FIG. 10 shows a result of measuring a current of device II after inputting a specific pulse signal to the device in order to measure an excitatory postsynaptic current (EPSC) which is one of the characteristics of a biological synapse. For reference, the excitatory postsynaptic current (hereinafter referred to as 'EPSC') refers to a temporary current caused by the flow of ions to postsynaptic neurons resulting from a voltage pulses applied to presynaptic neurons.

Referring to FIG. 10, a presynaptic neuron spike with a voltage amplitude of 0.7V and a period of 0.01 sec (0.7V, 0.01 sec) was applied to the presynaptic neurons. In order to measure the EPSC, a read voltage of 0.1V was applied constantly for 3.9 seconds, and a change in current was observed after the presynaptic neuron spike of 0.7V. The peak value of EPSC was about $7.33\times10^4$ A, and after the presynaptic neuron spike was applied to the device II, the current of the device gradually decreased and remained constant (saturation). This is one of the important behaviors which show the characteristics of synapses.

FIGS. 11A, 11B and 11C show results of measuring a current change of device II over time after applying a continuous pulse to the device in order to observe a transition from short term potentiation to long term potentiation (LTP), which is one of the characteristics of biological synapses. A schematic diagram of the voltage pulse was shown in FIG. 11A, wherein the amplitude was 0.6V, and the period was 0.02 seconds.

Referring to FIG. 11B, it can be seen that the current of the device II achieves long term potentiation (LTP) due to the presence of a conductive path, but does not fully lead to long term potentiation (LTP) with only five consecutive pulses. This is because it is not enough to form a complete conductive path in the device. In contrast, when the number of pulses applied to device II reaches 30, it is confirmed that the current does not change for 48 seconds. As described above, since the repeated pulses form a stable conductive path through charge trapping, the transition from short term potentiation (STP) to long term potentiation (LTP) is closely concerned with the number of applied pulses.

Referring to FIG. 11C, it can be observed that the current of device II is maintained for 1500 seconds after a complete transition from short term potentiation (STP) to long term potentiation (LTP). This indicates the stable performance of the electronic synaptic device of the present invention.

The present invention is not limited by the above-described embodiments and the accompanying drawings, but is intended to be limited by the appended claims. Therefore, it can be said that various types of substitutions, modifications and changes can be made by those of ordinary skill in the art without departing from the technical spirit of the present invention described in the claims, and such substitutions, modifications and changes also belong to the scope of the present invention.

DESCRIPTION OF REFERENCE NUMERALS

100: lower electrode
200: active layer
210: protein matrix
220: conductive nanoparticles
300: upper electrode

What is claimed is:

1. An electronic synaptic device comprising:
   a lower electrode;
   an upper electrode; and
   an active layer provided between the lower electrode and the upper electrode and comprising a plurality of conductive nanoparticles,
   wherein the conductive nanoparticles are dispersed in a matrix forming a continuous phase, and the matrix is composed of a protein,
   wherein the protein is gelatin, and
   wherein the electronic synaptic device is a nonvolatile memory device whose resistance changes according to an applied voltage.

2. The electronic synaptic device of claim 1, wherein the conductive nanoparticles are metal nanoparticles including at least one metal selected from the group consisting of Au, Zn, Cu, In, Ag, Sn, Sb, Ni, Fe and Pt.

3. The electronic synaptic device of claim 1, wherein the conductive nanoparticles are metal oxide nanoparticles including at least one metal oxide selected from the group consisting of $SiO_2$, CaO, $Cr_2O_3$, $MnO_2$, $TiO_2$, $ZrO_2$, $Y_2O_3$, MgO, $HfO_2$, ZnO, $Al_2O_3$, $SnO_2$, ITO (Indium tin oxide) and InZO (Indium zinc oxide).

4. The electronic synaptic device of claim 1, wherein the conductive nanoparticles are metal nitride nanoparticles including at least one metal nitride selected from the group consisting of TiN, ZrN, NbN, CrN, VN, TaN, WN, AlN, GaN, InN and $Si_3N_4$.

5. The electronic synaptic device of claim 1, wherein the conductive nanoparticles are conductive polymer nanoparticles including at least one conductive polymer selected from the group consisting of polymethyl methacrylate (PMMA), polyethylene (PE), polyethyleneimine (PEI), poly (3,4-ethylenedioxythiophene) (PEDOT), polytetrafluoroethylene (PTFE), polyvinylidene fluoride (PVDF) and poly (vinylphenol) (PVP).

6. The electronic synaptic device of claim 1, wherein the conductive nanoparticles are one or more quantum dots selected from the group consisting of CdS quantum dots, ZnSe quantum dots, ZnS quantum dots, CdSe quantum dots, CdTe quantum dots, PbS quantum dots, PbSe quantum dots, InP quantum dots, GaAs quantum dots, GaN quantum dots, graphene quantum dots, CNT quantum dots, $CH_3NH_3PbBr$ perovskite quantum dots, $WS_2$ quantum dots, $MoS_2$ quantum dots, $CsPbCl_3$ perovskite quantum dots, $CuInS_2$ quantum dots, $Cu_2ZnSnS_4$ quantum dots, CdTe/ZnTe quantum dots having a core-shell structure, $Au/Al_2O_3$ quantum dots having a core-shell structure, InP/GaAs quantum dots having a core-shell structure, CdTe/CdZnTe quantum dots having a core-shell structure, CdSe/CdS/ZnS quantum dots having a core-shell-shell structure, and CdSe/ZnS quantum dots having a core-shell structure.

7. The electronic synaptic device of claim 1, wherein the conductive nanoparticles have an average particle diameter of 5 to 100 nm.

8. The electronic synaptic device of claim 1, wherein a ratio of a total volume of the conductive nanoparticles to a total volume of the matrix is 1:5 to 1:10.

9. The electronic synaptic device of claim 1, wherein the active layer has a thickness of 10 to 1000 nm.

10. The electronic synaptic device of claim 1, wherein the active layer has a multilayer structure of two or three layers.

11. A neuromorphic device comprising the electronic synaptic device of claim 1.

12. A method for manufacturing an electronic synaptic device, the method comprising the steps of: forming a lower electrode, forming an active layer on the lower electrode, and forming an upper electrode on the active layer,
    wherein the step of forming the active layer includes the steps of:
    preparing a protein solution;
    mixing conductive nanoparticles with the protein solution to obtain a mixed solution; and
    coating or depositing the mixed solution on the lower electrode,
    wherein the protein is gelatin, and
    wherein the electronic synaptic device is a nonvolatile memory device whose resistance changes according to an applied voltage.

13. The method of claim 12, wherein the coating is spin coating or spray coating.

14. The method of claim 12, wherein the deposition is vacuum thermal evaporation.

* * * * *